US007630198B2

(12) United States Patent  
Doll

(10) Patent No.: US 7,630,198 B2
(45) Date of Patent: Dec. 8, 2009

(54) MULTI-STAGE AIR MOVERS FOR COOLING COMPUTER SYSTEMS AND FOR OTHER USES

(75) Inventor: Wade J. Doll, Seattle, WA (US)

(73) Assignee: Cray Inc., Seattle, WA (US)

( * ) Notice: Subject to any disclaimer, the term of this patent is extended or adjusted under 35 U.S.C. 154(b) by 382 days.

(21) Appl. No.: 11/371,272

(22) Filed: Mar. 8, 2006

(65) Prior Publication Data

US 2007/0211428 A1   Sep. 13, 2007

(51) Int. Cl.
H05K 7/00 (2006.01)

(52) U.S. Cl. ............... 361/679.49; 454/187; 62/259.2; 417/14

(58) Field of Classification Search .......... 361/697, 361/671–674, 709–719, 701, 704; 454/184
See application file for complete search history.

(56) References Cited

U.S. PATENT DOCUMENTS

| | | |
|---|---|---|
| 2,628,018 A | 2/1953 | Koch |
| 2,673,721 A | 3/1954 | Dickinson |
| 2,861,782 A | 11/1958 | Swartz |
| 3,120,166 A | 2/1964 | Lyman |
| 3,192,306 A | 6/1965 | Skonnord |
| 3,236,296 A | 2/1966 | Dubin |
| 3,317,798 A | 5/1967 | Chu et al. |
| 3,348,609 A | 10/1967 | Dubin et al. |
| 3,525,385 A | 8/1970 | Liebert |
| 3,559,728 A | 2/1971 | Lyman et al. |
| 3,903,404 A | 9/1975 | Beall et al. |
| 3,942,426 A | 3/1976 | Binks et al. |
| 4,016,357 A | 4/1977 | Abrahamsen |
| 4,158,875 A | 6/1979 | Tajima et al. |
| 4,261,519 A | 4/1981 | Ester |
| 4,270,362 A | 6/1981 | Lancia et al. |
| 4,271,678 A | 6/1981 | Liebert |
| 4,306,613 A | 12/1981 | Christopher |
| 4,313,310 A | 2/1982 | Kobayashi et al. |
| 4,315,300 A | 2/1982 | Parmerlee et al. |
| 4,386,651 A | 6/1983 | Reinhard |
| 4,449,579 A | 5/1984 | Miyazaki et al. |
| 4,458,296 A | 7/1984 | Bryant et al. |

(Continued)

FOREIGN PATENT DOCUMENTS

JP    2004-79754    8/2002

(Continued)

OTHER PUBLICATIONS

Bleier, Frank P., "FAN Handbook, Selection, Application, and Design," McGraw Hill, 1998, pp. 7.50-7.51.

(Continued)

Primary Examiner—Hung V Duong
(74) Attorney, Agent, or Firm—Perkins Coie LLP

(57) ABSTRACT

Multi-stage air movers for cooling computers and other systems are described herein. In one embodiment, a computer system includes a computer cabinet holding a plurality of computer modules. The computer cabinet includes an air inlet and an air outlet. The computer system further includes a multi-stage air mover configured to move a flow of cooling air from the air inlet, past the plurality of computer modules, and out the computer cabinet via the air outlet.

19 Claims, 5 Drawing Sheets

U.S. PATENT DOCUMENTS

| | | | |
|---|---|---|---|
| 4,473,382 A | 9/1984 | Cheslock | |
| 4,513,351 A | 4/1985 | Davis et al. | |
| 4,528,614 A | 7/1985 | Shariff et al. | |
| 4,535,386 A | 8/1985 | Frey, Jr. et al. | |
| 4,642,715 A | 2/1987 | Ende | |
| 4,644,443 A | 2/1987 | Swensen et al. | |
| 4,691,274 A | 9/1987 | Matouk et al. | |
| 4,702,154 A | 10/1987 | Dodson | |
| 4,728,160 A | 3/1988 | Mondor et al. | |
| 4,767,262 A | 8/1988 | Simon | |
| 4,774,631 A | 9/1988 | Okuyama et al. | |
| 4,797,783 A | 1/1989 | Kohmoto et al. | |
| 4,798,238 A | 1/1989 | Ghiraldi | |
| 4,860,163 A | 8/1989 | Sarath | |
| 4,874,127 A | 10/1989 | Collier | |
| 4,901,200 A | 2/1990 | Mazura | |
| 4,911,231 A | 3/1990 | Horne et al. | |
| 4,993,482 A | 2/1991 | Dolbear et al. | |
| 5,000,079 A | 3/1991 | Mardis | |
| 5,019,880 A | 5/1991 | Higgins, III | |
| 5,035,628 A | 7/1991 | Casciotti et al. | |
| 5,060,716 A | 10/1991 | Heine | |
| 5,090,476 A | 2/1992 | Immel | |
| 5,101,320 A | 3/1992 | Bhargava et al. | |
| 5,131,233 A | 7/1992 | Cray et al. | |
| 5,150,277 A | 9/1992 | Bainbridge et al. | |
| 5,161,087 A | 11/1992 | Frankeny et al. | |
| 5,165,466 A | 11/1992 | Arbabian | |
| 5,196,989 A | 3/1993 | Zsolnay | |
| 5,263,538 A | 11/1993 | Amidieu et al. | |
| 5,273,438 A | 12/1993 | Bradley | |
| 5,297,990 A | 3/1994 | Renz et al. | |
| 5,323,847 A | 6/1994 | Koizumi et al. | |
| 5,326,317 A | 7/1994 | Ishizu et al. | |
| 5,329,425 A | 7/1994 | Leyssens et al. | |
| 5,339,214 A | 8/1994 | Nelson | |
| 5,345,779 A | 9/1994 | Feeney | |
| 5,365,402 A | 11/1994 | Hatada et al. | |
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker, III et al. | |
| 5,467,250 A | 11/1995 | Howard et al. | |
| 5,467,609 A | 11/1995 | Feeney | |
| 5,471,850 A | 12/1995 | Cowans | |
| 5,491,310 A | 2/1996 | Jen | |
| 5,493,474 A | 2/1996 | Schkrohowsky et al. | |
| 5,572,403 A | 11/1996 | Mills | |
| 5,603,375 A | 2/1997 | Salt | |
| 5,685,363 A | 11/1997 | Orihira et al. | |
| 5,707,205 A | 1/1998 | Otsuka et al. | |
| 5,709,100 A | 1/1998 | Baer et al. | |
| 5,718,628 A | 2/1998 | Nakazato et al. | |
| 5,749,702 A | 5/1998 | Datta et al. | |
| 5,782,546 A | 7/1998 | Iwatare | |
| 5,793,610 A | 8/1998 | Schmitt et al. | |
| 5,880,931 A | 3/1999 | Tilton et al. | |
| 5,927,386 A | 7/1999 | Lin | |
| 5,979,541 A | 11/1999 | Saito et al. | |
| 6,026,565 A | 2/2000 | Giannatto et al. | |
| 6,046,908 A | 4/2000 | Feng | |
| 6,061,237 A | 5/2000 | Sands et al. | |
| 6,104,608 A | 8/2000 | Casinelli et al. | |
| 6,115,242 A | 9/2000 | Lambrecht | |
| 6,132,171 A | 10/2000 | Fujinaka et al. | |
| 6,158,502 A | 12/2000 | Thomas | |
| 6,164,369 A | 12/2000 | Stoller | |
| 6,167,948 B1 | 1/2001 | Thomas | |
| 6,182,787 B1 | 2/2001 | Kraft et al. | |
| 6,183,196 B1 | 2/2001 | Fujinaka | |
| 6,185,098 B1 | 2/2001 | Benavides | |
| 6,205,796 B1 | 3/2001 | Chu et al. | |
| 6,208,510 B1 | 3/2001 | Trudeau et al. | |
| 6,236,564 B1 | 5/2001 | Fan | |
| 6,305,180 B1 | 10/2001 | Miller et al. | |
| 6,310,773 B1 | 10/2001 | Yusuf et al. | |
| 6,332,946 B1 | 12/2001 | Emmett et al. | |
| 6,351,381 B1 | 2/2002 | Bilski et al. | |
| 6,359,779 B1 | 3/2002 | Frank, Jr. et al. | |
| 6,361,892 B1 | 3/2002 | Ruhl et al. | |
| 6,416,330 B1 | 7/2002 | Yatskov | |
| 6,435,266 B1 | 8/2002 | Wu | |
| 6,439,340 B1 | 8/2002 | Shirvan | |
| 6,462,944 B1 * | 10/2002 | Lin | 361/687 |
| 6,501,652 B2 | 12/2002 | Katsui | |
| 6,515,862 B1 | 2/2003 | Wong et al. | |
| 6,519,955 B2 | 2/2003 | Marsala | |
| 6,524,064 B2 | 2/2003 | Chou et al. | |
| 6,546,998 B2 | 4/2003 | Oh et al. | |
| 6,554,697 B1 | 4/2003 | Koplin | |
| 6,557,357 B2 | 5/2003 | Spinazzola et al. | |
| 6,557,624 B1 | 5/2003 | Stahl et al. | |
| 6,564,571 B2 | 5/2003 | Feeney | |
| 6,564,858 B1 | 5/2003 | Stahl | |
| 6,582,192 B2 | 6/2003 | Tseng et al. | |
| 6,609,592 B2 | 8/2003 | Wilson | |
| 6,628,520 B2 | 9/2003 | Patel et al. | |
| 6,631,078 B2 | 10/2003 | Alcoe | |
| 6,644,384 B2 | 11/2003 | Stahl | |
| 6,661,660 B2 | 12/2003 | Prasher et al. | |
| 6,679,081 B2 | 1/2004 | Marsala | |
| 6,684,457 B2 | 2/2004 | Holt | |
| 6,690,576 B2 | 2/2004 | Clements et al. | |
| 6,705,625 B2 | 3/2004 | Holt et al. | |
| 6,714,412 B1 | 3/2004 | Chu et al. | |
| 6,724,617 B2 | 4/2004 | Amaike et al. | |
| 6,745,579 B2 | 6/2004 | Spinazzola et al. | |
| 6,755,280 B2 | 6/2004 | Porte et al. | |
| 6,761,212 B2 | 7/2004 | DiPaolo | |
| 6,772,604 B2 | 8/2004 | Bash et al. | |
| 6,775,137 B2 | 8/2004 | Chu et al. | |
| 6,776,707 B2 | 8/2004 | Koplin | |
| 6,796,372 B2 | 9/2004 | Bear | |
| 6,819,563 B1 | 11/2004 | Chu et al. | |
| 6,836,407 B2 | 12/2004 | Faneuf et al. | |
| 6,854,659 B2 | 2/2005 | Stahl et al. | |
| 6,860,713 B2 * | 3/2005 | Hoover | 415/66 |
| 6,867,966 B2 * | 3/2005 | Smith et al. | 361/679.48 |
| 6,881,898 B2 | 4/2005 | Baker et al. | |
| 6,882,531 B2 | 4/2005 | Modica | |
| 6,904,968 B2 | 6/2005 | Beitelmal et al. | |
| 6,909,611 B2 | 6/2005 | Smith et al. | |
| 6,914,780 B1 | 7/2005 | Shanker et al. | |
| 6,975,510 B1 | 12/2005 | Robbins et al. | |
| 6,992,889 B1 | 1/2006 | Kashiwagi et al. | |
| 6,997,245 B2 | 2/2006 | Lindemuth et al. | |
| 6,997,741 B2 | 2/2006 | Doll | |
| 6,999,316 B2 | 2/2006 | Hamman | |
| 7,051,802 B2 | 5/2006 | Baer | |
| 7,051,946 B2 | 5/2006 | Bash et al. | |
| 7,059,899 B2 | 6/2006 | Doll | |
| 7,120,017 B2 * | 10/2006 | Shieh | 361/695 |
| 7,120,027 B2 | 10/2006 | Yatskov et al. | |
| 7,123,477 B2 | 10/2006 | Coglitore et al. | |
| 7,144,320 B2 | 12/2006 | Turek et al. | |
| 7,152,418 B2 | 12/2006 | Alappat et al. | |
| 7,154,748 B2 | 12/2006 | Yamada | |
| 7,177,156 B2 | 2/2007 | Yatskov et al. | |
| 7,182,208 B2 | 2/2007 | Tachibana | |
| 7,187,549 B2 | 3/2007 | Teneketges et al. | |
| 7,193,846 B1 * | 3/2007 | Davis et al. | 361/687 |
| 7,193,851 B2 | 3/2007 | Yatskov et al. | |
| 7,226,353 B2 | 6/2007 | Bettridge et al. | |
| 7,242,579 B2 | 7/2007 | Fernandez et al. | |

| | | |
|---|---|---|
| 7,255,640 B2 | 8/2007 | Aldag et al. |
| 7,259,963 B2 | 8/2007 | Germagian et al. |
| 7,286,351 B2 | 10/2007 | Campbell et al. |
| 7,304,842 B2 | 12/2007 | Yatskov et al. |
| 7,314,113 B2 | 1/2008 | Doll |
| 7,315,448 B1 | 1/2008 | Bash et al. |
| 7,330,350 B2 | 2/2008 | Hellregel et al. |
| 7,362,571 B2 | 4/2008 | Kelley et al. |
| 7,385,810 B2 | 6/2008 | Chu et al. |
| 7,397,661 B2 | 7/2008 | Campbell et al. |
| 7,411,785 B2 | 8/2008 | Doll |
| 7,418,825 B1 | 9/2008 | Bean, Jr. |
| 7,430,118 B1 | 9/2008 | Noteboom et al. |
| 2001/0052412 A1 | 12/2001 | Tikka |
| 2002/0172007 A1 | 11/2002 | Pautsch |
| 2002/0181200 A1 | 12/2002 | Chang |
| 2003/0010477 A1 | 1/2003 | Khrustalev et al. |
| 2003/0056941 A1 | 3/2003 | Lai et al. |
| 2003/0161102 A1 | 8/2003 | Lee et al. |
| 2003/0183446 A1 | 10/2003 | Shah et al. |
| 2004/0008491 A1 | 1/2004 | Chen |
| 2004/0033135 A1 | 2/2004 | Chang |
| 2004/0052052 A1 | 3/2004 | Rivera |
| 2004/0250990 A1 | 12/2004 | Schaper |
| 2005/0120737 A1 | 6/2005 | Borror et al. |
| 2005/0161205 A1 | 7/2005 | Ashe et al. |
| 2005/0162834 A1 | 7/2005 | Nishimura |
| 2005/0168945 A1 | 8/2005 | Coglitore |
| 2005/0186070 A1* | 8/2005 | Zeng et al. ............... 415/211.2 |
| 2005/0207116 A1 | 9/2005 | Yatskov et al. |
| 2005/0225936 A1 | 10/2005 | Day |
| 2005/0241810 A1 | 11/2005 | Malone et al. |
| 2006/0018094 A1 | 1/2006 | Robbins et al. |
| 2006/0102322 A1 | 5/2006 | Madara et al. |
| 2006/0180301 A1 | 8/2006 | Baer |
| 2007/0030650 A1 | 2/2007 | Madara et al. |
| 2008/0018212 A1 | 1/2008 | Spearing et al. |
| 2008/0078202 A1 | 4/2008 | Luo |
| 2008/0092387 A1 | 4/2008 | Campbell et al. |
| 2008/0098763 A1 | 5/2008 | Yamaoka |
| 2008/0216493 A1 | 9/2008 | Lin et al. |

FOREIGN PATENT DOCUMENTS

| | | |
|---|---|---|
| JP | 2004-079754 | 8/2002 |
| WO | WO-01/86217 A1 | 11/2001 |
| WO | WO 2005/027609 | 3/2005 |
| WO | WO-2005/027609 | 3/2005 |

OTHER PUBLICATIONS

"Managing Extreme Heat Cooling Strategies for High-Density Computer Systems," Liebert Corporation, Dec. 7, 2003, Columbus, OH, 16 pages.

Marsala, Joe, "Pumped Liquid/Two Phase Cooling for High Performance Systems," Thermal Form & Function LLC, May 13, 2003, Scottsdale, AZ, 19 pages.

U.S. Appl. No. 11/958,114, filed Dec. 17, 2007, Yatskov.

U.S. Appl. No. 12/029,124, filed Feb. 11, 2008, Kelley et al.

U.S. Appl. No. 12/060,377, filed Apr. 1, 2008, Doll.

Baer, D. B., "Emerging Cooling Requirements & Systems in Telecommunications Spaces," Telecommunications Energy Conference 2001, Oct. 14-18, 2001, pp. 95-100.

"Frequently Asked Questions about Heat Pipes," Thermacore International, Inc., http://www.thermacore.com/hpt_faqs.htm, 3 pages [accessed Jun. 14, 2004].

Hannemann, R. et al., "Pumped Liquid Multiphase Cooling," ASME, 2004, IMECE 2004, Paper IMECE2004-60669, Anaheim, CA, 5 pages.

Novel Concepts, Inc., "Heat Spreaders," http://www.novelconceptsinc.com/heat-spreaders.htm, 2 pages [accessed Jun. 14, 2004].

JAMSTEC/Earth Simulator Center, "Processor Node (PN) Cabinet," http://www.es.jamstec.go.jp/esc/eng/Hardware/pnc.html, 1 page [accessed Mar. 5, 2004].

Pitasi, M. "Thermal Management System Using Pumped Liquid R-134a with Two Phase Heat Transfer," Thermal Form & Function LLC, Manchester, MA, Mar. 2002, pp. 1-9, http:/www.coolingzone.com/Guest/News/NL_MAR_2002/TFF/Tff.html.

"Therma-base-Heat Sink," Thermacore Thermal Management Solutions, pp. 1-3, [accessed Jun. 14, 2005].

Thermal Form & Function LLC, "Box/Blade Cooling System," http://www.thermalformandfunction.com/boxsystem.html, Manchester, MA, 2005, 1 page [accessed May 10, 2006].

"Thermal Form & Function—Rack Cooling System (RCS)," Thermal Form & Function LLC, 2005, Manchester, MA, one page, http:/www.thermalformandfunction.com/racksystem.html, [accessed May 11, 2006].

Vogel, M. et al., "Low Profile Heat Sink Cooling Technologies for Next Generation CPU Thermal Designs," Electronic Cooling Online, Feb. 17, 2005,11 pages.

Webb, W., "Take the heat: Cool that hot embedded design," EDN, May 13, 2004, 5 pages.

Non-Final Office Action for U.S. Appl. No. 11/958,114, Mail Date Aug. 25, 2009, 22 pages.

Non-Final Office Action for U.S. Appl. No. 12/060,377, Mail Date Sep. 23, 2009, 10 pages.

U.S. Appl. No. 12/253,672, filed Oct. 17, 2008, Doll et al.

U.S. Appl. No. 12/253,692, filed Oct. 17, 2008, Doll et al.

* cited by examiner

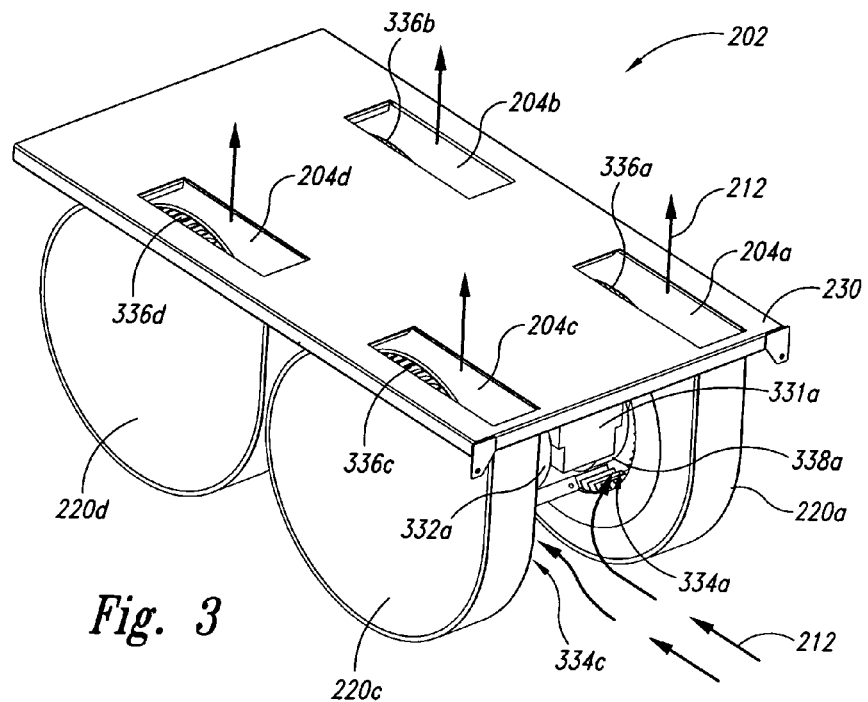
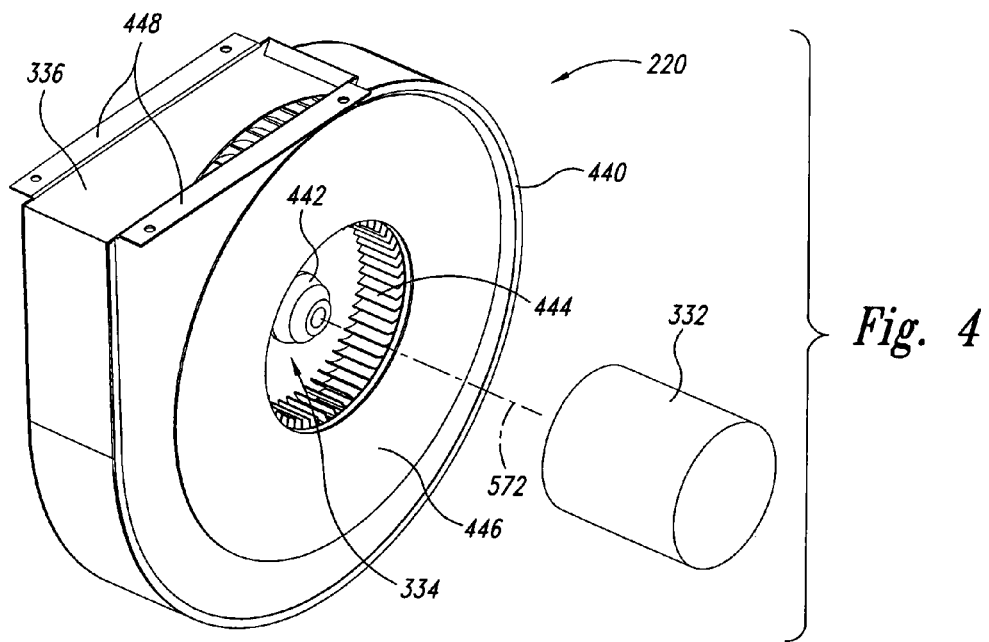

MULTI-STAGE AIR MOVERS FOR COOLING COMPUTER SYSTEMS AND FOR OTHER USES

TECHNICAL FIELD

The following disclosure relates generally to computer air conditioning systems and, more particularly, to air movers for use with such air conditioning systems.

BACKGROUND

Supercomputers and other large computer systems typically include a large number of computer cabinets arranged in close proximity to each other. FIG. 1, for example, illustrates a portion of a prior art supercomputer system 100 having plurality of computer cabinets 110 arranged in a bank. The computer cabinets 110 are arranged in a bank to conserve floor space and increase computational speed by reducing cable lengths between cabinets. Each of the computer cabinets 110 includes a plurality of computer module compartments 118 (identified individually as a first module compartment 118a, a second module compartment 118b, and a third module compartment 118c). Each module compartment 118 holds a plurality of computer modules 112. Like the computer cabinets 110, the computer modules 112 are also positioned in close proximity to each other to conserve space and increase computational speed. Each of the computer modules 112 can include a motherboard electrically connecting a plurality of processors, memory modules, routers, and other microelectronic devices together for data and/or power transmission.

Many of the electronic devices typically found in supercomputers, such as fast processing devices, generate considerable heat during operation. This heat can damage the device and/or degrade performance if not dissipated during operation. Consequently, supercomputers typically include both active and passive cooling systems to maintain device temperatures at acceptable levels.

To dissipate heat generated by the computer modules 112, the prior art supercomputer system 100 further includes a plurality of centrifugal fans 120 mounted to upper portions of corresponding computer cabinets 110. In operation, each of the centrifugal fans 120 draws cooling air into the corresponding computer cabinet 110 through a front inlet 114 and/or a back inlet 115 positioned toward a bottom portion of the computer cabinet 110. The cooling air flows upwardly through the computer cabinet 110, past the computer modules 112, and into a central inlet 122 of the fan 120. The centrifugal fan 120 then exhausts the cooling air outward in a radial pattern through a circumferential outlet 124.

One problem associated with the prior art supercomputer system 100 is the inability of the centrifugal fan 120 to move a sufficient amount of air through the computer cabinet 110 for adequate cooling when the density of the computer modules 112 increases. As more computer modules 112 are installed in a given space (e.g., by decreasing the spacing between two adjacent computer modules 112), available flow paths for cooling air decrease, thereby increasing the pressure drop as the cooling air flows past the computer modules 112. The centrifugal fan 120 typically has a generally flat operating curve (i.e., the generated pressure differentials are nearly constant with respect to different volumetric flow rates). As a result, as the centrifugal fan 120 increases the output pressure differential to compensate for the increased pressure drop, the flow rate of the cooling air through the computer cabinet 110 is significantly reduced. The reduction in cooling air flow can cause overheating of the computer modules 112, and thus adversely affect performance of the computer system 100.

Conventional techniques for increasing cooling air flow in densely packed computer cabinet 110 include increasing the size of the centrifugal fan 120 and increasing the operating speed of the centrifugal fan 120. There are a number of shortcomings associated with each of these solutions. First, increasing the size of the centrifugal fan 120 increases the power consumption of the centrifugal fan 120. In addition, the computer cabinet 110 may not have enough space to accommodate a fan 120 of increased size. Second, increasing the operating speed of the centrifugal fans 120 can cause a substantial increase in operating noise and power consumption.

BRIEF DESCRIPTION OF THE DRAWINGS

FIG. 3 is an enlarged isometric view of an air mover assembly from the computer cabinet of FIG. 2.

FIG. 4 is an isometric view of a multi-stage air mover from FIGS. 2 and 3, configured in accordance with an embodiment of the invention.

DETAILED DESCRIPTION

Figure 1:
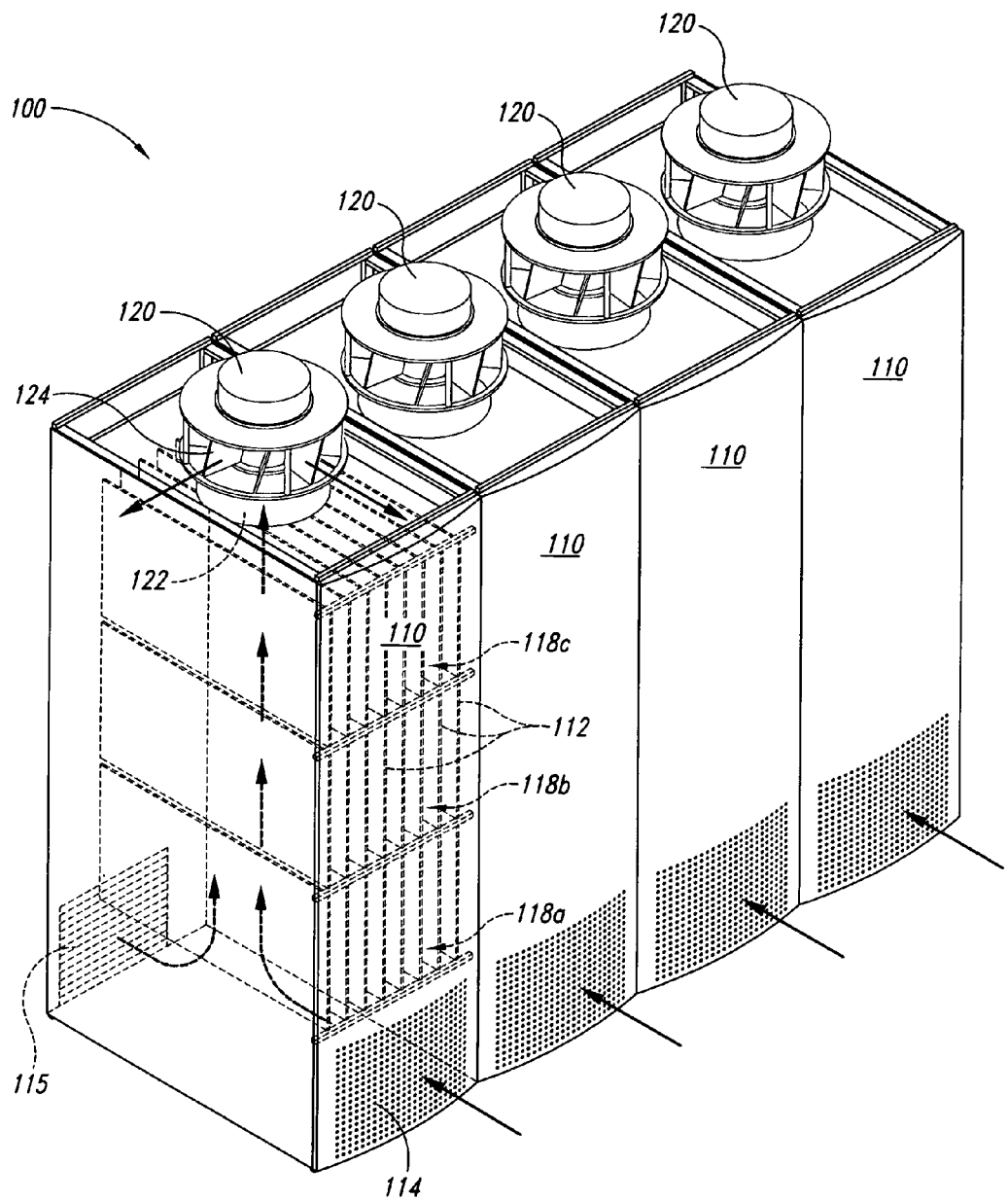
FIG. 1 is an isometric view of a bank of computer cabinets having top-mounted cooling fans configured in accordance with the prior art.

The following disclosure describes several embodiments of multi-stage air movers for use with computer cabinet air conditioning systems and other air conditioning systems. One aspect of the invention is directed toward a computer system that includes a computer cabinet holding a plurality of computer modules. The computer cabinet has an air inlet and an air outlet. The computer system further includes a multi-stage air mover carried by the computer cabinet. The multi-stage air mover is configured to move a flow of cooling air from the air inlet, past the plurality of computer modules, and out the computer cabinet via the air outlet. The multi-stage air mover includes first and second rotating blade sets in generally annular arrangements about an axis of rotation. The first and second rotating blade sets are at least approximately aligned in a radial direction extending outwardly from the longitudinal axis of rotation. Here, the term "radial direction" generally refers to a direction that is perpendicular to the longitudinal axis of rotation.

A computer system configured in accordance with another aspect of the invention includes a computer module and an air mover positioned inside a computer cabinet. The air mover includes a plurality of radially positioned rotating blade sets that are configured to move a flow of cooling air through the computer cabinet and past the computer module. In this aspect of the invention, the air mover can also include a stationary blade set positioned at least partially between two adjacent rotating blade sets.

A further aspect of the invention is directed toward an air mover assembly for use with a computer cabinet. The air mover assembly includes a first multi-stage air mover attached to a mounting plate having first and second openings. The first multi-stage air mover has a first outlet in fluid communication with the first opening. The air mover assembly also includes a second multi-stage air mover attached to the mounting plate. The second multi-stage air mover has a second outlet in fluid communication with the second opening. A motor is operatively coupled to at least the first multi-stage air mover to drive air through the computer cabinet via the first opening in the mounting plate.

A further aspect of the invention is directed toward a centrifugal air mover that includes a rotating portion carrying a plurality of blade sets. Each of the blade sets is in a generally annular arrangement about an axis of rotation. Further, the blade sets are at least approximately aligned in a radial direction extending outwardly from the longitudinal axis of rotation. The air mover also includes a stationary portion carrying at least one blade set positioned at least partially between two adjacent blade sets of the rotating portion.

A further aspect of the invention is directed toward a method for cooling a plurality of computer modules carried by a computer cabinet. The computer cabinet includes an air inlet and an air outlet. The method includes positioning a multi-stage air mover inside the computer cabinet proximate to the air inlet, and operating the multi-stage air mover to drive a flow of cooling air from the air inlet through the computer cabinet, past the computer modules, and into the room through the air outlet. In this aspect of the invention, the multi-stage air mover includes first, second, and third blade sets at least approximately aligned in a radial direction extending outwardly from an axis of rotation. Each of the blade sets is in a generally annular arrangement about the axis of rotation, and the third blade set is positioned at least partially between the first and second blade sets.

Specific details of several embodiments of the invention are described below with reference to FIGS. 2-6 to provide a thorough understanding of the embodiments. Other details describing well-known structures and systems often associated with computer cabinets and associated air conditioning equipment, however, are not set forth below to avoid obscuring the description of the various embodiments. Those of ordinary skill in the art will understand that the invention may have other embodiments in addition to those described below. Such embodiments may lack one or more of the elements described below. Alternatively, such embodiments may include other elements in addition to those described below.

In the Figures, identical reference numbers identify identical or at least generally similar elements. To facilitate the discussion of any particular element, the most significant digit or digits of any reference number refer to the Figure in which that element is first introduced. Element 202, for example, is first introduced and discussed with reference to FIG. 2.

Figure 2:
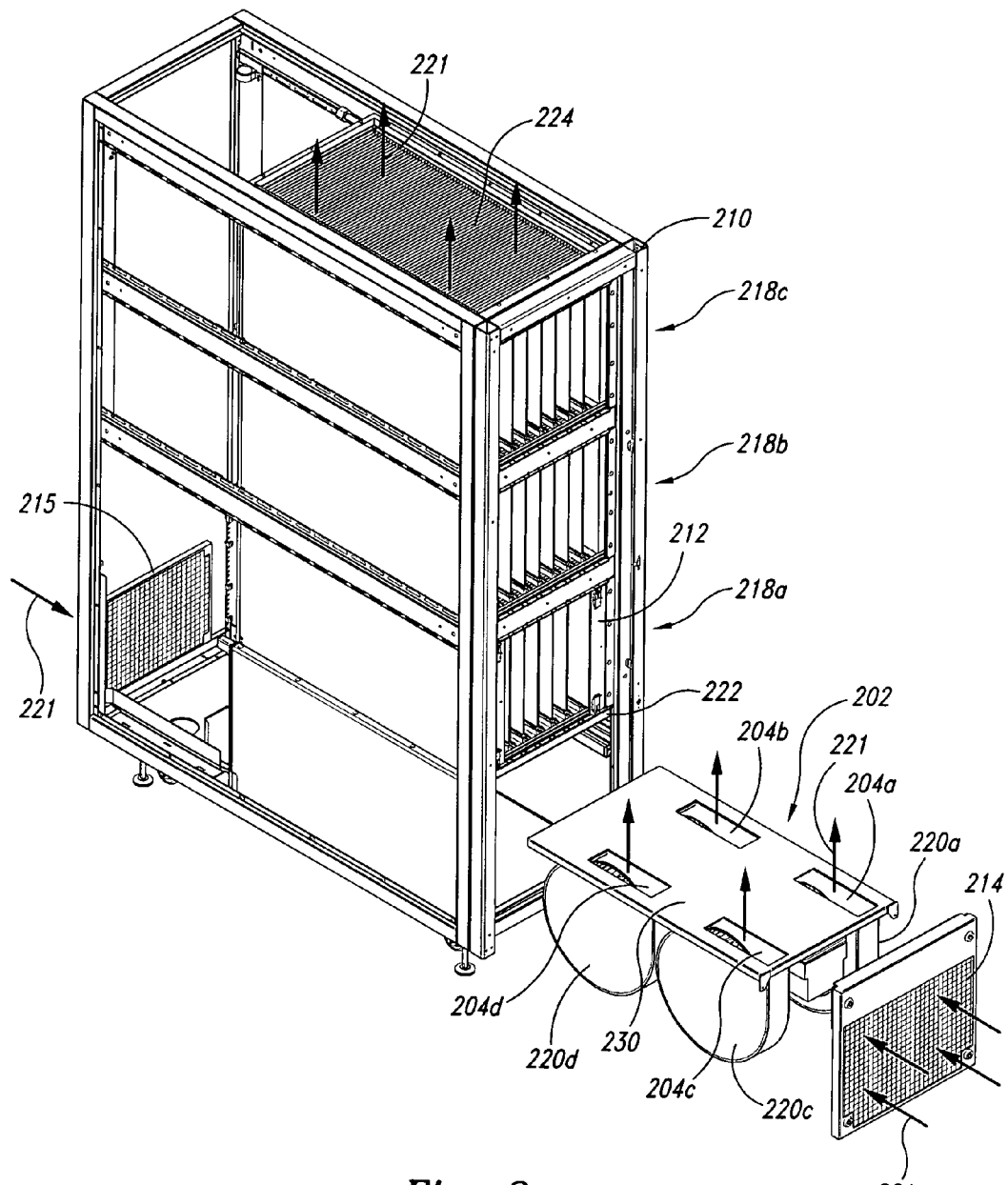
FIG. 2 is a partially exploded isometric view of a computer cabinet having a plurality of multi-stage air movers configured in accordance with an embodiment of the invention.

FIG. 2 is a partially exploded isometric view of a computer cabinet 210 that carries a plurality of multi-stage air movers 220 ("air movers 220") configured in accordance with an embodiment of the invention. In the illustrated embodiment, some external panels of the computer cabinet 210 have been removed for clarity. Many features of the computer cabinet 210 can be at least generally similar in structure and function to corresponding features of the computer cabinet 110 described above with reference to FIG. 1. For example, the computer cabinet 210 can include a plurality of computer module compartments 218 holding a plurality of computer modules 212 in vertical, edge-wise orientation. The computer cabinet 210 can further include a front inlet 214 and a back inlet 215 positioned toward a bottom portion of the computer cabinet 210, and an outlet 224 positioned toward a top portion of the computer cabinet 210.

In one aspect of this embodiment, the computer cabinet 210 includes an air mover assembly 202 positioned toward the bottom portion of the computer cabinet 210 to drive cooling air through the computer cabinet 210. The air mover assembly 202 can include a plurality of air movers 220 (identified individually as air movers 220a-d) attached to a mounting plate 230. The mounting plate 230 includes a plurality of openings 204 (identified individually as openings 204a-d) positioned proximate to the air movers 220. One embodiment of the air mover assembly 202 is described in more detail below with reference to FIG. 3.

The computer cabinet 210 can optionally include a distribution member 222 positioned toward the bottom portion of the computer cabinet 210 above the openings 204. The distribution member 222 can include features that influence the flow pattern of cooling air in the computer cabinet 210. For example, the distribution member 222 can include a plurality of apertures, channels, vanes, or other structures configured to equalize the flow of cooling air over the cross-section of the computer cabinet 210. Although the illustrated embodiment shows one distribution member 222 positioned proximate to the air mover assembly 202, in other embodiments, the computer cabinet 210 can include other distribution members 222 in other positions, such as in each computer module compartment 218. Alternatively, the distribution member 222 can be omitted.

The computer cabinet 210 can also include one or more sensors (not shown) for monitoring operating conditions of the computer modules 212. For example, the computer cabinet 210 can include one or more temperature sensors (e.g., thermocouples, RTD, or inferred temperature monitors), flow sensors (e.g., flow switches and flow transmitters), pressure sensors (e.g., pressure switches and pressure transmitters), and/or other types of sensors capable of measuring parameters indicative of the operating conditions of the computer modules 212. For instance, the computer cabinet 210 can include thermocouples (not shown) positioned in each computer module compartment 218 to monitor operating temperatures inside the computer cabinet 210. In another example, the computer cabinet 210 can include a flow transmitter (not shown) positioned toward the top portion of the computer cabinet 210 to measure a cooling air flow rate in the top portion.

In operation, the air mover assembly 202 draws cooling air (represented by arrows 221) into the computer cabinet 210 via the front inlet 214 and the back inlet 215. The air movers 220 compress the cooling air and drive it upwardly through the openings 204 and the distribution member 222. The cooling air then flows generally evenly through the computer cabinet 210 and past the computer modules 212 before exiting the computer cabinet 210 through the outlet 224. As the cooling air 221 moves past the computer modules 212, the cooling air 221 carries away heat generated during operation of the computer modules 212. The operating conditions of the computer modules 212 can be monitored with one or more of the optional sensors described above.

FIG. 3 is an enlarged isometric view of the air mover assembly 202 of FIG. 2. In the embodiment of FIG. 3, the air movers 220 are arranged in face-to-face pairs. A motor 332 is operatively coupled to each pair of opposing air movers 220 by a corresponding shaft 338. Each of the air movers 220 includes an air inlet 334 and an air outlet 336. The air outlet 336 is in fluid communication with the corresponding opening 204 of the mounting plate 230. For example, the multi-stage air mover 220a includes an air outlet 336a that is in fluid communication with the opening 204a.

Optionally, the air mover assembly 202 can further include two speed controllers 331 that are attached to the mounting plate 230 and operatively coupled to the motors 332. The speed controllers 331 can be configured to dynamically adjust operating speeds of the motors 332. For example, the speed controllers 331 can include variable frequency drives ("VFDs") for adjusting power frequencies applied to the motors 332 to change rotating speeds. One example of a suitable VFD is the "Sub-micro AC drive" produced by AC Technology Corporation of Uxbridge, Mass. In other embodiments, other suitable VFDs can be used.

In operation, the motors 332 drive the pairs of corresponding air movers 220 to move a flow of cooling air through the computer cabinet 210. Specifically, the cooling air enters the air movers 220 via the annular or circular air inlets 334 on the inboard side of the air movers 220. The air movers 220 then compress the cooling air and discharge it through the openings 204. The air movers 220 provide sufficient pressure to drive the cooling air past the densely-packed computer modules 212 as further described below with reference to FIGS. 4-6. Optionally, the motor speeds can be regulated using the speed controllers 331 to achieve a desired flow rate at the top portion of the computer cabinet 210 or a desired operating temperature inside the computer cabinet 210.

Although the illustrated embodiment shows two pairs of air movers 220 in face-to-face arrangements with motors positioned there between, in other embodiments, air mover assemblies configured in accordance with the present disclosure can include more or fewer air movers in different arrangements. For example, in another embodiment, the air mover assembly 202 can include one pair of face-to-face air movers 220 operatively coupled to a motor positioned there between. In a further embodiment, an air mover assembly 202 configured in accordance with the present disclosure can include multiple pairs of air movers 220 arranged in tandem. Accordingly, the present invention is not limited to an air mover assembly 202 having two pairs of air movers 220 in the particular arrangement of FIG. 3.

FIG. 4 is an isometric view of one of the air movers 220 (e.g. the air mover 220a) of FIG. 3, configured in accordance with an embodiment of the invention. A plurality of mounting flanges 448 are positioned around the air outlet 336 and configured to attach the air mover 220 to the mounting plate 230 (FIGS. 2 and 3). The air mover 220 can include a rotating portion 444 and a stationary portion 446 carried by a housing 440. The air inlet 334 is positioned adjacent to the stationary portion 446 and in fluid communication with the rotating portion 444. The air mover 220 can further include a central coupler 442 configured to operatively couple the rotating portion 444 to the motor 332.

Figure 5:
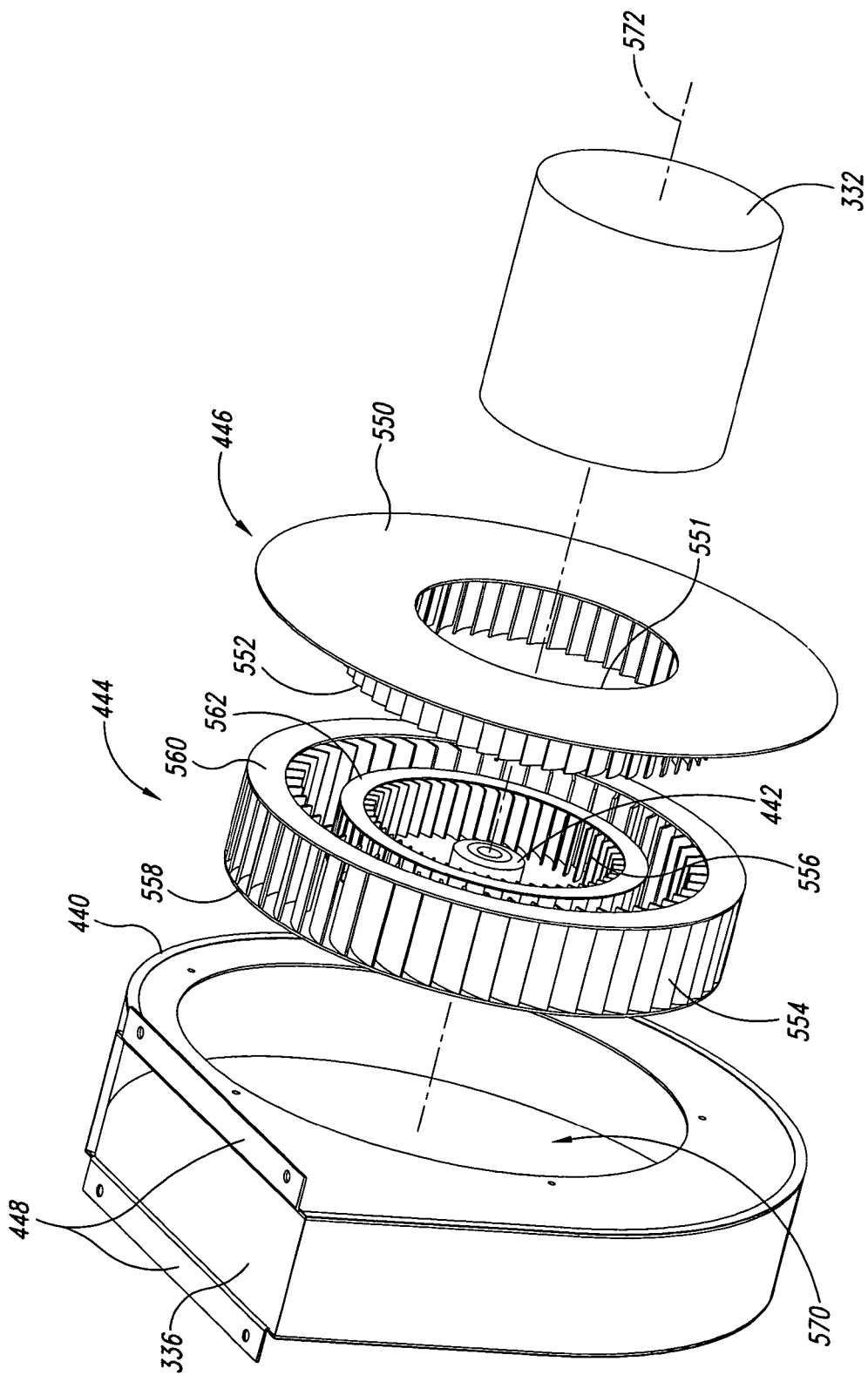
FIG. 5 is a partially exploded isometric view of the multi-stage air mover of FIG. 4.

FIG. 5 is a partially exploded isometric view of the air mover 220 of FIG. 4, illustrating a number of features in greater detail. In one aspect of the embodiment, the housing 440 includes an internal cavity 570. The internal cavity 570 has a generally circular shape configured to accommodate the rotating portion 444 and the stationary portion 446. The internal cavity 570 is larger than the rotating portion 444, thereby forming an annular gap between the housing 440 and the rotating portion 444 when assembled. The housing 440 can be constructed of any suitable material including, for example, ductile iron, cast aluminum, stainless steel, plastic, and/or any other material having sufficient rigidity.

In the illustrated embodiment, the rotating portion 444 includes a first blade set 556 and a second blade set 554 that are carried by a back plate 558. The first and second blade sets 554 and 556 form generally annular arrangements about a longitudinal axis of rotation 572. A first annular face plate 560 is attached to the first blade set 554, and a second annular face plate 562 is attached to the second blade set 556. The back plate 558 and face plates 562 can be constructed from any suitable material including, for example, ductile iron, cast aluminum, stainless steel, plastic, and/or any other material having sufficient rigidity.

In the illustrated embodiment, the stationary portion 446 can include a third blade set 552 attached to a stationary plate 550. The stationary plate 550 includes an opening 551 generally concentric to the axis of rotation 572. The opening 551 provides access to allow the rotating portion 444 to engage the motor 332 with the central coupler 442. The opening 551 has a larger diameter than the motor 332 to provide an annular gap that forms the air inlet 334. The stationary plate 550 can be constructed from any suitable material including, for example, fiberglass, plastic, paper, cast aluminum, stainless steel, and/or any other material having sufficient rigidity, strength, flexibility, etc.

When assembled as shown in FIG. 4, the blade sets 552, 554, and 556 can be at least approximately aligned in a radial direction extending outwardly from the longitudinal axis of rotation 572. In this regard, the stationary third blade set 552 can be positioned at least partially between the rotating first and second blade sets 554 and 556 to direct the compressed air from the first blade set 556 to the second blade set 554, as further described in more detail below with reference to FIG. 6.

Figure 6:
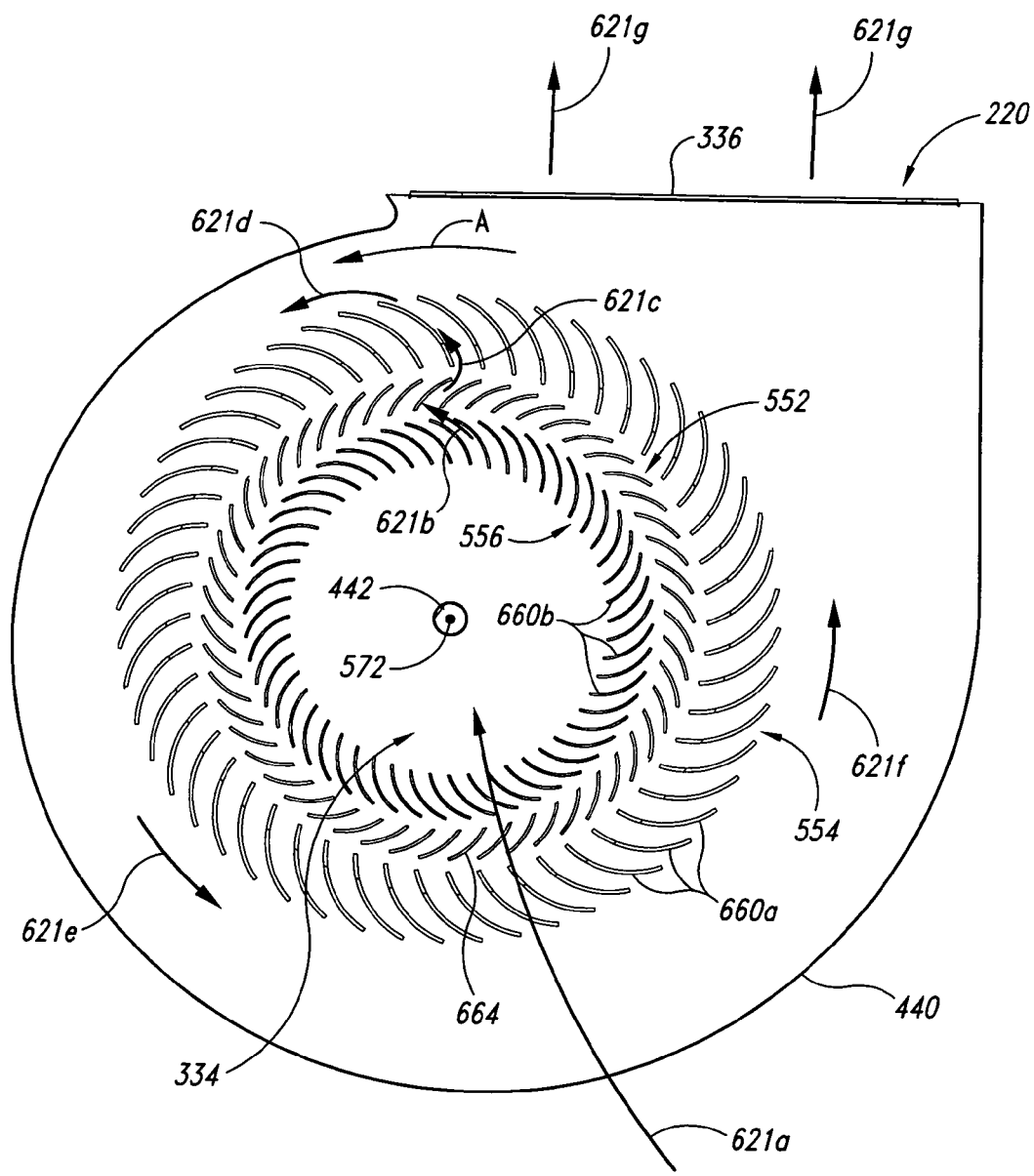
FIG. 6 is a side cross-sectional view illustrating one embodiment of the multi-stage air mover of FIG. 4.

FIG. 6 is a side cross-sectional view of the air mover 220 of FIG. 4, configured in accordance with an embodiment of the invention. In one aspect of this embodiment, each of the rotating blade sets 554 and 556 can be concentrically positioned about the longitudinal axis of rotation 572. The two rotating blade sets 554 and 556 are spaced apart radially by an annular gap configured to accommodate the stationary blade set 552.

In another aspect of the invention, each of the rotating blade sets 554 and 556 can include a plurality of forward curved blades 660 (identified individually as forward curved blades 660a and 660b, respectively). the term "forward curved" generally refers to having a radially outward curve that is at least partially in a direction of rotation. The forward curved blades 660a and 660b can have generally similar curvatures and shapes, and can be generally parallel to each other as illustrated in FIG. 6. In other embodiments, the blades 660a can have different curvatures and/or shapes. For example, the blades 660 can be straight, backward curved, or a combination of straight and curved blades. The term "backward curved" generally refers to having a radially outward curve that is at least partially opposite to a direction of rotation. The blades 660 can be constructed from cast aluminum, stainless steel, titanium, brass, or any other suitable material with sufficient strength, rigidity, etc.

In another aspect of the invention, the stationary blade set 552 can include, for example, a plurality of backward curved straightening vanes 664 configured to direct the compressed cooling air from the first blade set 556 to the second blade set 554. The term "straightening vanes" generally refers to structures that modify (e.g., straighten) a fluid flow path. In the illustrated embodiment, the straightening vanes 664 are positioned between the first rotating blade set 554 and the second rotating blade set 556. The straightening vanes 664 can be constructed from cast aluminum, stainless steel, titanium, brass, or any other suitable material with sufficient strength, rigidity, etc.

In operation, the motor 332 (FIGS. 4 and 5) drives the rotating blade sets 554 and 556 in a counter-clockwise direction (as indicated by arrow A) about the axis of rotation 572. As the blades rotate, cooling air 621 (represented by arrows 621a) enters the air mover 220 via the air inlet 334. The first rotating blade set 556 applies a centrifugal force to increase kinetic energy of the cooling air 621 as it drives the air outwardly and into the stationary blade set 552 (represented by arrow 621b). The stationary blade set 552 directs the cooling air 621 exiting the first blade set 556 into the second rotating blade set 554 (represented by arrow 621c). The second rotating blade set 556 then applies additional centrifugal force to the redirected cooling air 621 to further increase the kinetic energy of the cooling air 621 as it exits the second rotating blade set 554. The cooling air 621 then flows around the housing 440 (represented by arrows 621e and 621f) before exiting the air mover 220 via the air outlet 336 (represented by arrow 621g).

There are a number of advantages associated with the air mover 220. One advantage is that the air mover 220 can achieve a significantly higher pressure than conventional air movers of similar size. Without being bound by theory, it is believed that directing the cooling air from the first rotating blade set 556 through the straightening vanes 664 allows the second rotating blade set 554 to capture the large tangential velocity of the cooling air leaving the first rotating blade set 556. As a result, the cooling air exiting the second rotating blade set 554 has gone through a multi-stage boost to achieve higher pressures than can be achieved with conventional, single stage air movers of comparable size. Accordingly, the rotating blade sets 554 and 556 form compression stages that incrementally increase the air pressure of the cooling air. Another advantage of the air mover 220 is that it is relatively efficient from a power consumption standpoint because it can produce sufficient discharge pressures to move the cooling air through the computer cabinet 210 at relatively low operating speeds. A further advantage related to the relative low operating speed is that the air mover 220 is relatively quiet.

Although the illustrated embodiment shows two rotating blade sets and one stationary blade set, in other embodiments, an air mover 220 configured in accordance with the present disclosure can include more or fewer rotating blade sets and/or more or fewer stationary blade sets in similar or different arrangements. For example, in another embodiment, the rotating portion 444 can include three blade sets and the stationary portion can include two blade sets interposed between the rotating blade sets. That is, each of the two stationary blade sets can be positioned at least partially between two adjacent rotating blade sets. In a further embodiment, an air mover configured in accordance with the present disclosure can include straight and/or backward curved blades in a generally annular arrangement about the axis of rotation 572. Accordingly, the present invention is not limited to air movers having two rotating blade sets and one stationary blade set in the particular arrangement of FIG. 6, but extends to all other configurations that fall within the scope of the present disclosure.

Furthermore, even though embodiments of the present invention have been described above in the context of air movers for use in computer cabinets, the invention is not limited to air movers. For example, other embodiments can be used to move other types of materials, such as gaseous materials (e.g., nitrogen, oxygen, argon, hydrogen, carbon dioxide, natural gas, and steam), liquid materials (e.g., water, oil, and gasoline), or granulized solids (e.g., laundry detergent powder and cement). The device can be used in chemical and/or physical processes, such as chemical processing, oil refining, food processing, etc.

From the foregoing, it will be appreciated that specific embodiments of the invention have been described herein for purposes of illustration, but that various modifications may be made without deviating from the spirit and scope of the invention. For example, although elements of the invention described above have been presented in one or more arrangements, in other embodiments, other arrangements are possible depending on the particular situation. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A computer system comprising:
a plurality of computer modules;
a computer cabinet holding the plurality of computer modules, the computer cabinet including an air inlet and an air outlet; and
a multi-stage air mover carried by the computer cabinet, wherein the multi-stage air mover is configured to move a flow of cooling air from the air inlet, past the plurality of computer modules, and out the computer cabinet via the air outlet, wherein the multi-stage air mover includes first and second rotating blade sets, and wherein the multi-stage air mover further includes a stationary portion carrying a third blade set positioned in an annular arrangement about the axis of rotation, and wherein the third blade set is further positioned at least partially between the first and second blade sets.

2. The computer system of claim 1 wherein each of the first and second rotating blade sets includes a plurality of forward curved blades.

3. The computer system of claim 1 wherein each of the first and second rotating blade sets is positioned in an annular arrangement about an axis of rotation, and wherein the first and second rotating blade sets are at least approximately aligned in a radial direction extending outwardly from the longitudinal axis of rotation.

4. The computer system of claim 1, wherein the computer system further comprises a distributing member positioned proximate to the multi-stage air mover and configured to influence the flow of cooling air from the multi-stage air mover.

5. The computer system of claim 1, wherein the multi-stage air mover is a first multi-stage air mover having a first outlet, and wherein the computer system further comprises:
a second multi-stage air mover having a second outlet;
a mounting plate including first and second openings, wherein the first multi-stage air mover is attached to the mounting plate with the first outlet in fluid communication with the first opening, and wherein the second multi-stage air mover is attached to the mounting plate with the second outlet in fluid communication with the second opening; and
a motor operatively coupled to the first and second multi-stage air movers to drive air through the computer cabinet via the first and second openings in the mounting plate.

6. A computer system comprising:
a computer cabinet holding at least one computer module; and
an air mover positioned inside the computer cabinet, wherein the air mover includes a plurality of radially positioned rotating blade sets configured to move a flow of cooling air through the computer cabinet and past the at least one computer module, wherein the air mover further includes a stationary blade set positioned at least partially between two adjacent rotating blade sets.

7. The computer system of claim 6 wherein each of the rotating blade sets is positioned in an annular arrangement about an axis of rotation, and wherein the rotating blade sets are at least approximately aligned in a radial direction extending outwardly from the longitudinal axis of rotation.

8. The computer system of claim 6 wherein the stationary blade set and the rotating blade sets are at least approximately aligned in a radial direction extending outwardly from the longitudinal axis of rotation.

9. A centrifugal air mover comprising:
   a first rotating blade set positioned in an annular arrangement about an axis of rotation;
   at least a second rotating blade set positioned in a generally annular arrangement about the axis of rotation, wherein the first and second rotating blade sets are at least approximately aligned in a radial direction extending outwardly from the axis of rotation; and
   a stationary blade set positioned at least partially between the first and second rotating blade sets.

10. The air mover of claim 9 wherein the first and second rotating blade sets and the stationary blade set are at least approximately aligned in a radial direction extending outwardly from the longitudinal axis of rotation.

11. The air mover of claim 9 wherein each of the first and second rotating blade sets includes a plurality of blades, and wherein each of the blades is longitudinally aligned with the axis of rotation.

12. An air mover assembly for use with a computer cabinet, the air mover assembly comprising:
   a mounting plate having first and second openings;
   a first multi-stage air mover attached to the mounting plate, the first multi-stage air mover having a first outlet in fluid communication with the first opening; and
   a second multi-stage air mover attached to the mounting plate, the second multi-stage air mover having a second outlet in fluid communication with the second opening, wherein at least one of the first and second multi-stage air movers includes:
   a first rotating blade set positioned in an annular arrangement about an axis of rotation;
   a second rotating blade set positioned in an annular arrangement about the axis of rotation; and
   a stationary blade set positioned in an annular arrangement about the axis of rotation, and wherein the first stationary blade set is positioned at least partially between the first and second rotating blade sets.

13. The air mover assembly of claim 12 wherein the first and second blade sets are at least approximately aligned in a radial direction extending outwardly from the longitudinal axis of rotation.

14. The air mover assembly of claim 12 wherein the first and second rotating blade sets and the stationary blade set are at least approximately aligned in a radial direction extending outwardly from the axis of rotation.

15. The air mover assembly of claim 12 wherein the stationary blade set includes a plurality of straightening vanes.

16. A method for cooling a plurality of computer modules carried by a computer cabinet in a room, the computer cabinet including an air inlet and an air outlet, the method comprising:
   positioning a multi-stage air mover in the computer cabinet; and
   operating the multi-stage air mover to drive a flow of cooling air from the air inlet through the computer cabinet, past the computer modules, and into the room through the air outlet, wherein the multi-stage air mover includes first, second, and third blade sets at least approximately aligned in a radial direction extending outwardly from an axis of rotation, wherein operating the multi-stage air mover further comprises:
   compressing the flow of cooling air from the air inlet to a first pressure with the first blade set;
   at least partially radially directing the compressed cooling air from the first blade set to the third blade set with the second blade set; and
   further compressing the directed cooling air to a second pressure higher than the first pressure with the third blade set.

17. The method of claim 16 wherein positioning a multi-stage air mover includes mounting a multi-stage air mover toward a bottom portion of the computer cabinet.

18. A system for performing high-speed computations, the system comprising:
   means for holding at least one computer module;
   means for admitting a flow of cooling air from a room into the computer module holding means;
   a first compressing means for compressing the flow of cooling air to a first pressure; and
   a second compressing means for compressing the flow of cooling air from the first pressure to a second pressure higher than the first pressure, wherein the second compressing means are positioned in an annular arrangement around the first compressing means, wherein the system further comprises an air directing means for at least partially radially directing the flow of cooling air from the first compressing means to the second compressing means.

19. The system of claim 18 wherein the first and second compressing means are at least approximately aligned in a radial direction extending outwardly from an axis of rotation.

* * * * *

UNITED STATES PATENT AND TRADEMARK OFFICE
CERTIFICATE OF CORRECTION

PATENT NO. : 7,630,198 B2  Page 1 of 1
APPLICATION NO. : 11/371272
DATED : December 8, 2009
INVENTOR(S) : Wade J. Doll It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 657 days.

Signed and Sealed this

Twenty-first Day of December, 2010

David J. Kappos
*Director of the United States Patent and Trademark Office*